United States Patent [19]

Kodama et al.

[11] Patent Number: 5,478,498

[45] Date of Patent: Dec. 26, 1995

[54] DISORDERED FLUORITE-TYPE PHOTOCHEMICAL HOLE BURNING CRYSTAL CONTAINING $SM^{2+}$ AS ACTIVE IONS

[75] Inventors: Nobuhiro Kodama, Kanagawa; Kazuyuki Hirao, Kyoto; Shinichi Hara; Yuka Inoue, both of Kanagawa, all of Japan

[73] Assignee: Tosoh Corporation, Yamaguchi, Japan

[21] Appl. No.: 348,298

[22] Filed: Dec. 2, 1994

[30] Foreign Application Priority Data

| Dec. 3, 1993 | [JP] | Japan | 5-304059 |
| Dec. 3, 1993 | [JP] | Japan | 5-304060 |
| Dec. 22, 1993 | [JP] | Japan | 5-324299 |
| Dec. 22, 1993 | [JP] | Japan | 5-324300 |
| Dec. 22, 1993 | [JP] | Japan | 5-324301 |
| Dec. 22, 1993 | [JP] | Japan | 5-324302 |
| Jan. 31, 1994 | [JP] | Japan | 6-9733 |
| Jan. 31, 1994 | [JP] | Japan | 6-9734 |
| Apr. 12, 1994 | [JP] | Japan | 6-73233 |

[51] Int. Cl.$^6$ ............................ C01G 57/00; C30B 9/00
[52] U.S. Cl. .............. 252/301.4 H; 423/263; 423/464; 501/151; 501/152; 501/123
[58] Field of Search .............. 117/940; 252/301.4 H; 423/263, 464; 501/151, 152, 123

[56] References Cited

PUBLICATIONS

R. Jaaniso et al, "Room Temperature Persistent Spectral Hole Burning in SM-Doped $SrFCL_{1/2}Br_{1/2}$ Mixed Crystals", Europhysics Letters, 16 (6), pp. 569–574 (1991), Oct. 7, 1991.

C. Wei et al, "Two–Photon Hole Burning and Fluorescence–Line Narrowing Studies on $BaFCL_{0.5}Br_{0.5}:Sm^{2+}$ at 77 K", Journal of Luminescence, 43 (1989) 161–166.

K. Hirao et al, "High Temperature Persistent Spectral Hole Burning of $Sm^{2+}$ in Fluorohafnate Glasses", Journal of Non–Crystalline Solids, 152 (1993) 267–269.

K. Hirao et al, "Room–temperature Persistent Hole Burning of $Sm^{2+}$ in Oxide Glasses", Optics Letters, vol. 18, No. 19, Oct. 1, 1993.

*Primary Examiner*—C. Melissa Bonner
*Attorney, Agent, or Firm*—Sughrue, Mion, Zinn, Macpeak & Seas

[57] ABSTRACT

A disordered fluorite-type photochemical hole burning crystal contains $Sm^{2+}$ as active ions, and a composition except $Sm^{2+}$ is represented by a general formula $\alpha$-$(MALn)F_{6-v}X_v$ where $0 \leq v \leq 1$, and M is an element selected from Ca, Sr and Ba, A is an element selected from Na, K, Rb and Cs, Ln is an element selected from Y, La, Gd and Ce, and X is an element selected from Cl, Br and I. Stable hole burning occurs at the room temperature to create narrow holes. The crystal can be used as a superior optical recording material for a room temperature operation.

10 Claims, 15 Drawing Sheets

DISORDERED FLUORITE-TYPE PHOTOCHEMICAL HOLE BURNING CRYSTAL CONTAINING SM²⁺ AS ACTIVE IONS

BACKGROUND OF THE INVENTION

The present invention relates to a disordered fluorite-type crystal containing $Sm^{2+}$ as active ions, which crystal is a photochemical hole burning material suitable for high-density recording.

Photochemical hole burning (PHB) materials are now drawing much attention as a recording device which enables far higher recording density than currently available optical disks.

A PHB material is formed by dispersing photoactive ions in a proper matrix. Since photoactive ions occupy various sites of a crystal, a light absorption spectrum of the crystal has a non-uniform band. When laser light of a narrower wavelength range than the absorption band is applied to the crystal, only the photoactive ions resonating with the laser light are excited. Therefore, if part of the photoactive ions are rendered inactive by irradiation with laser light (writing operation), a steep drop (i.e., a "hole") appears in an absorption spectrum (reading operation). Ultrahigh-density recording can be realized by associating the presence/absence of a hole with digital information.

In the beginning of the development, photochemical PHB materials were formed by doping an inorganic polymer or a crystal with organic molecules capable of effecting the hole burning.

Recently, it has been proposed to dope a crystal with rare-earth ions. For example, it has been reported that a hole is created in $BaFCl_{0.5}Br_{0.5}$:$Sm^{2+}$ crystal at the liquid nitrogen temperature (C. Wei, S.Haung, et al., J. Luminescence, Vol. 143, pp. 161 (1989)). However, this crystal requires a very low operating temperature to effect hole burning. At a high operating temperature, an increased hole width reduces the recording density of a resulting recording device.

It has been reported that hole burning is observed at the room temperature in $SrFCl_{0.5}Br_{0.5}$:$Sm^{2+}$ (R. Jaaniso and H. Bill, Europhys. Lett., Vol. 16, pp. 569 (1991)). However, this crystal is produced only in a small size of at most 400 µm. Therefore, it cannot be said that this crystal has sufficient performance in practical use particularly in easiness of manufacture and material size. In addition, this crystal is considered to have another problem in practical use, i.e., a hole filling phenomenon in which a considerable part of a first hole is filled when a second hole is created adjacent to the first hole.

On the other hand, it has been reported that hole burning is observed at the room temperature in non-oxide glass, in particular, fluoride glass containing rare-earth ions, such as $HfF_4$ and $BaF_3$ (K. Hirao, S. Todoroki, et al., J. Non-Cryst. Solids, Vol. 152, pp. 267). However, because of a wide hole created, this type of materials are not suitable for practical use.

It has also been reported that oxide glass, more specifically, borate glass containing bivalent Sm ions is a stable burning material at the room temperature (K. Hirao, S. Todoroki, et al., Opt. Lett., Vol. 18, pp. 1586 (1993). Although this material can provide a smaller hole width than the above non-oxide materials, it is still not suitable for practical use.

At the present time, there has not been found any bulk single crystal material in which stable hole burning occurs at a temperature higher than the liquid nitrogen temperature, in particular, at the room temperature to create a sufficiently narrow hole, and which does not suffer from the hole filling phenomenon.

SUMMARY OF THE INVENTION

In view of the above, an object of the present invention is to provide a hole burning crystal in which stable hole burning occurs at a high temperature, in particular, at the room temperature, to create a narrow hole.

After conducting various investigations to attain the above object, the present inventors have found novel fluorite-type crystals containing $Sm^{2+}$ as photoactive ions in which crystals $Sm^{2+}$ ions exist stably to cause hole burning at a relatively high temperature of about the room temperature, and which crystals can provide a small hole width and a high hole multiplicity. The present inventors have completed the invention with a finding that the above crystals are produced by melting and solidifying a disordered fluoride crystal (host crystal) in a non-oxidizing atmosphere.

More specifically, the invention provides a disordered, high-temperature phase fluorite-type photochemical hole burning crystal which contains $Sm^{2+}$ as active ions, and in which a composition except $Sm^{2+}$ is represented by a general formula

$$\alpha\text{-}(MALn)F_{6-v}X_v (0 \leq v \leq 1)$$

where M is an element selected from the group consisting of Ca, Sr and Ba, A is an element selected from the group consisting of Na, K, Rb and Cs, Ln is an element selected from the group consisting of Y, La, Gd and Ce, and X is an element selected from the group consisting of Cl, Br and I.

DESCRIPTION OF THE PREFERRED EMBODIMENTS

Figure 1:
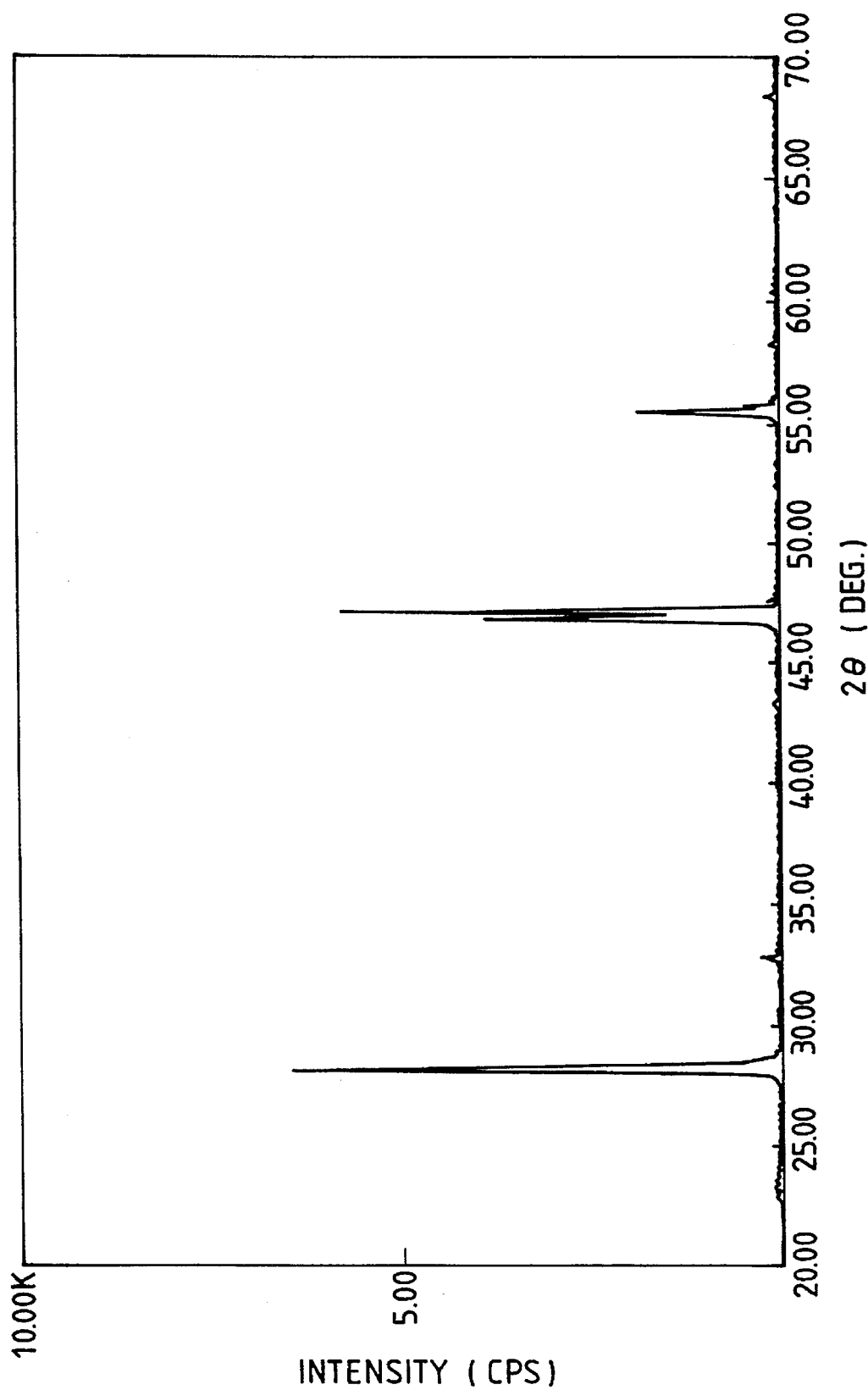
FIGS. 1–4 show typical X-ray diffraction results of crystals according to the present invention.
Figure 2:
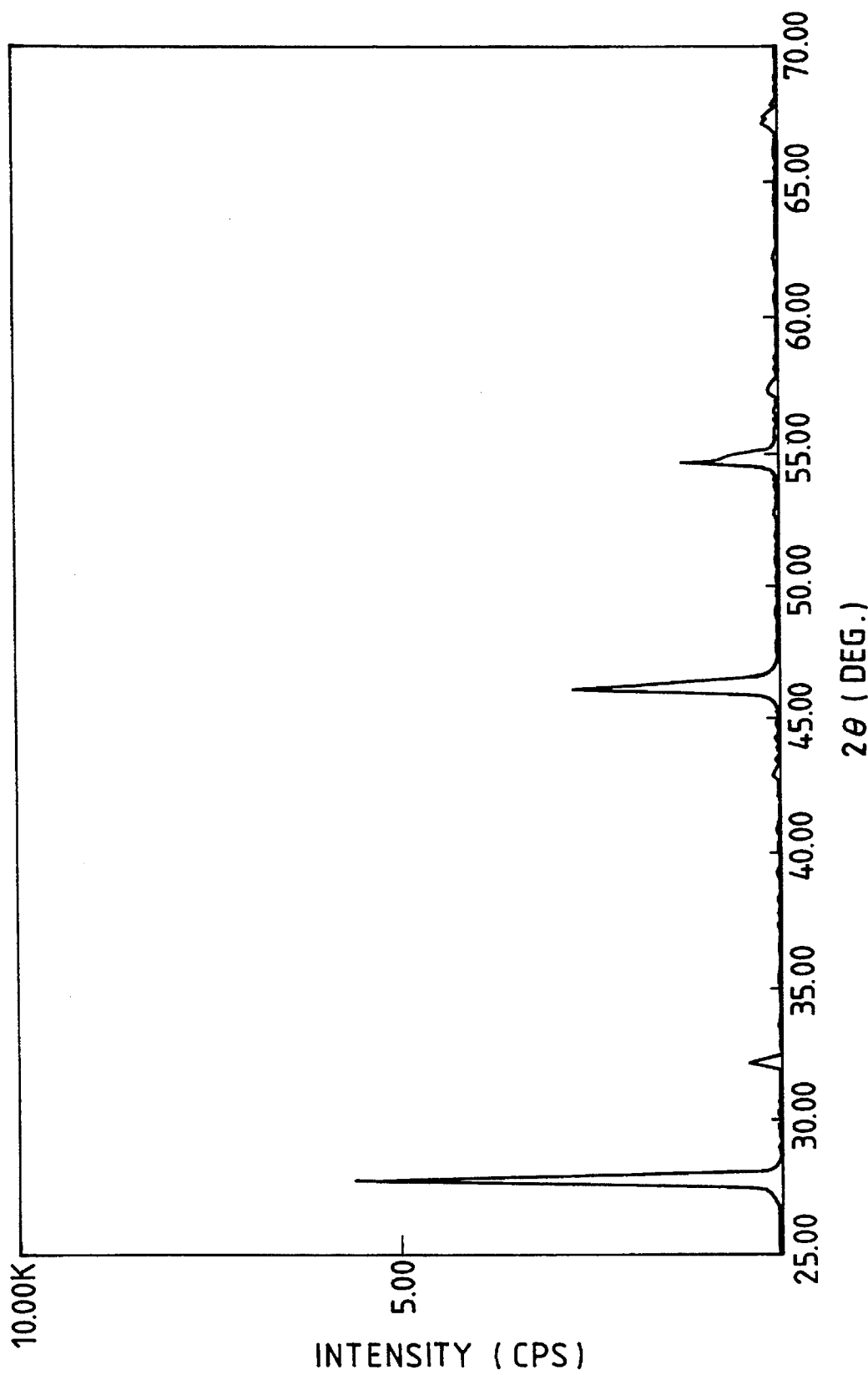
Figure 3:
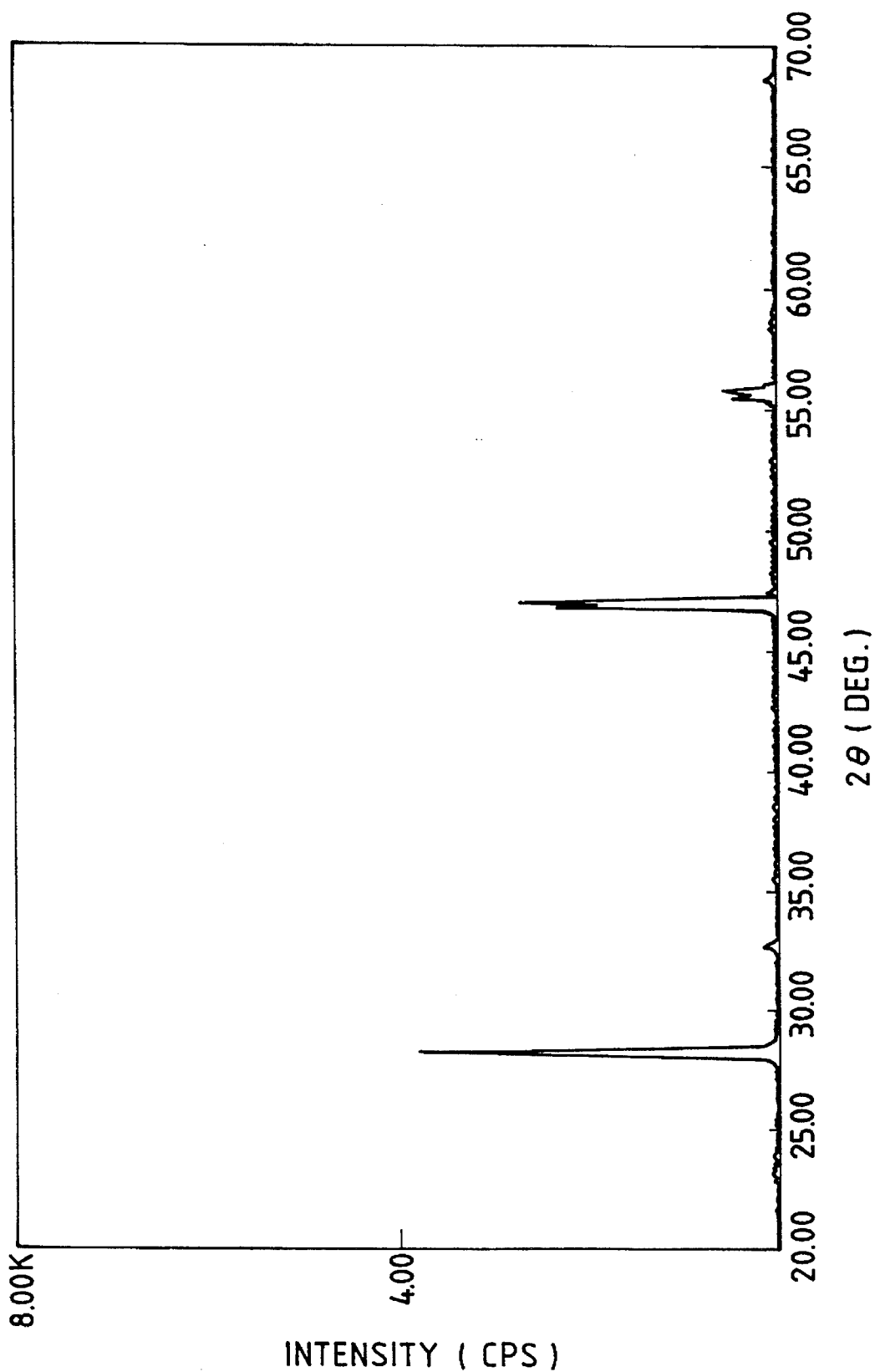
Figure 4:
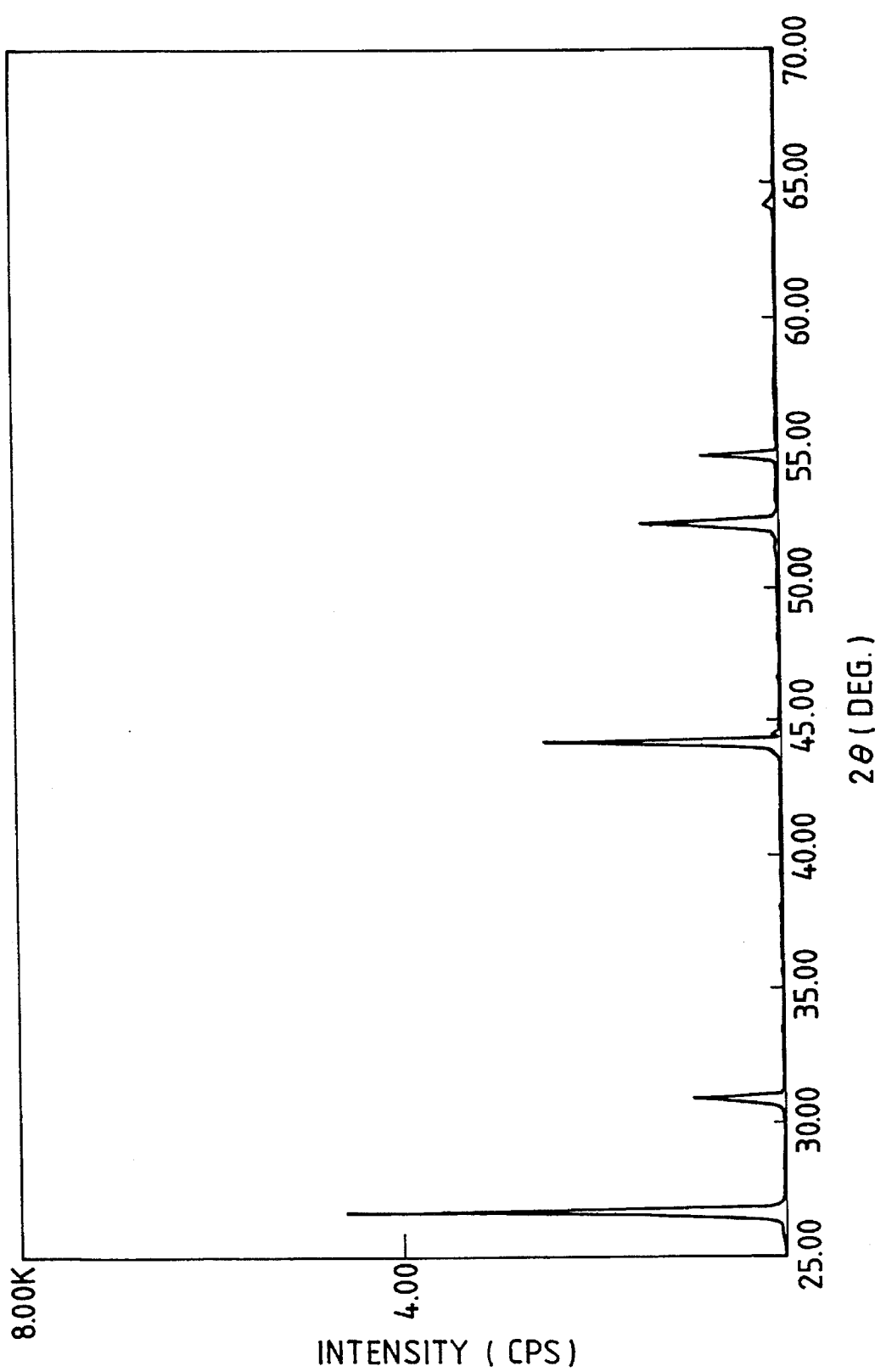
Figure 5:
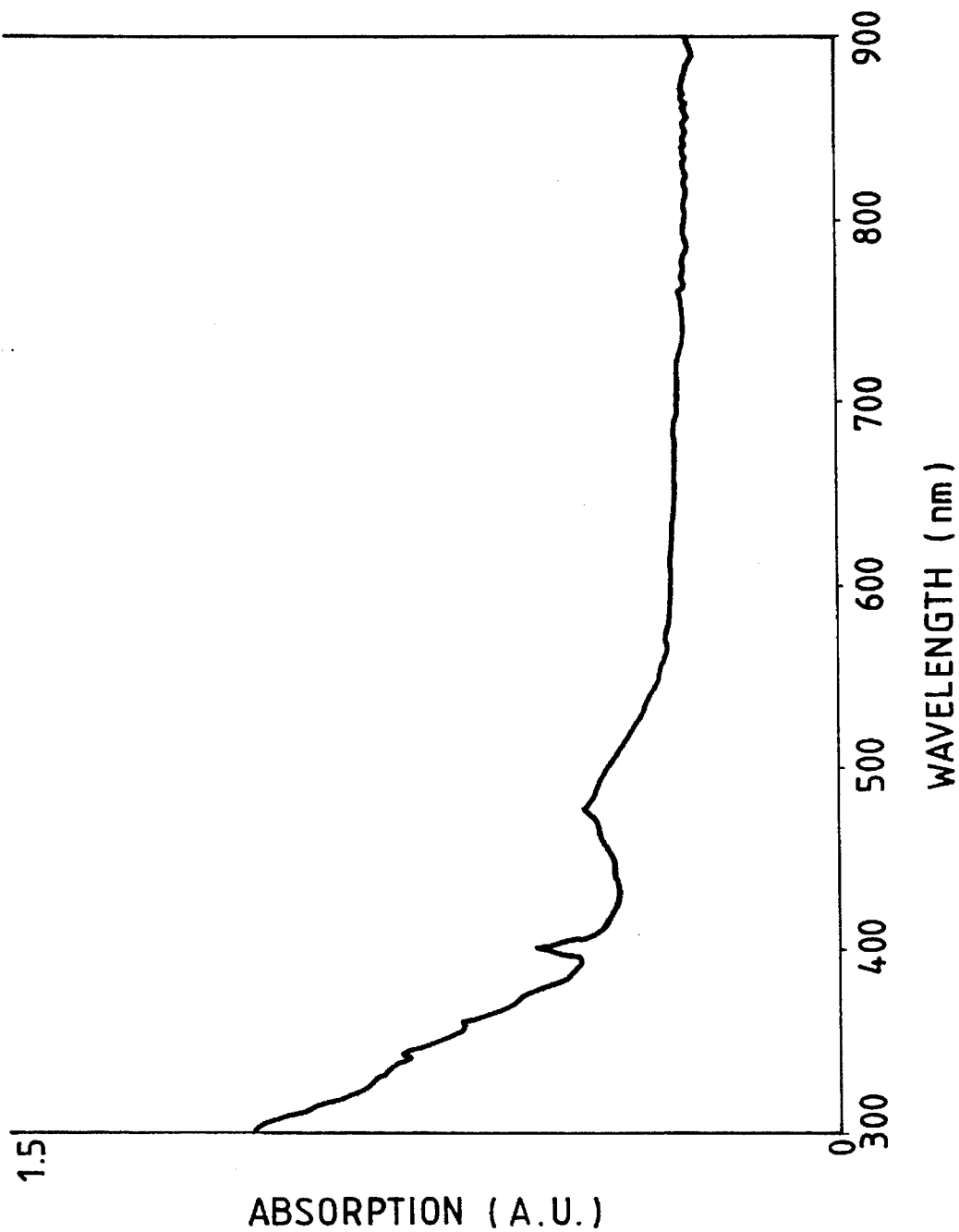
FIGS. 5–8 show typical absorption spectra of the crystals according to the invention.
Figure 6:
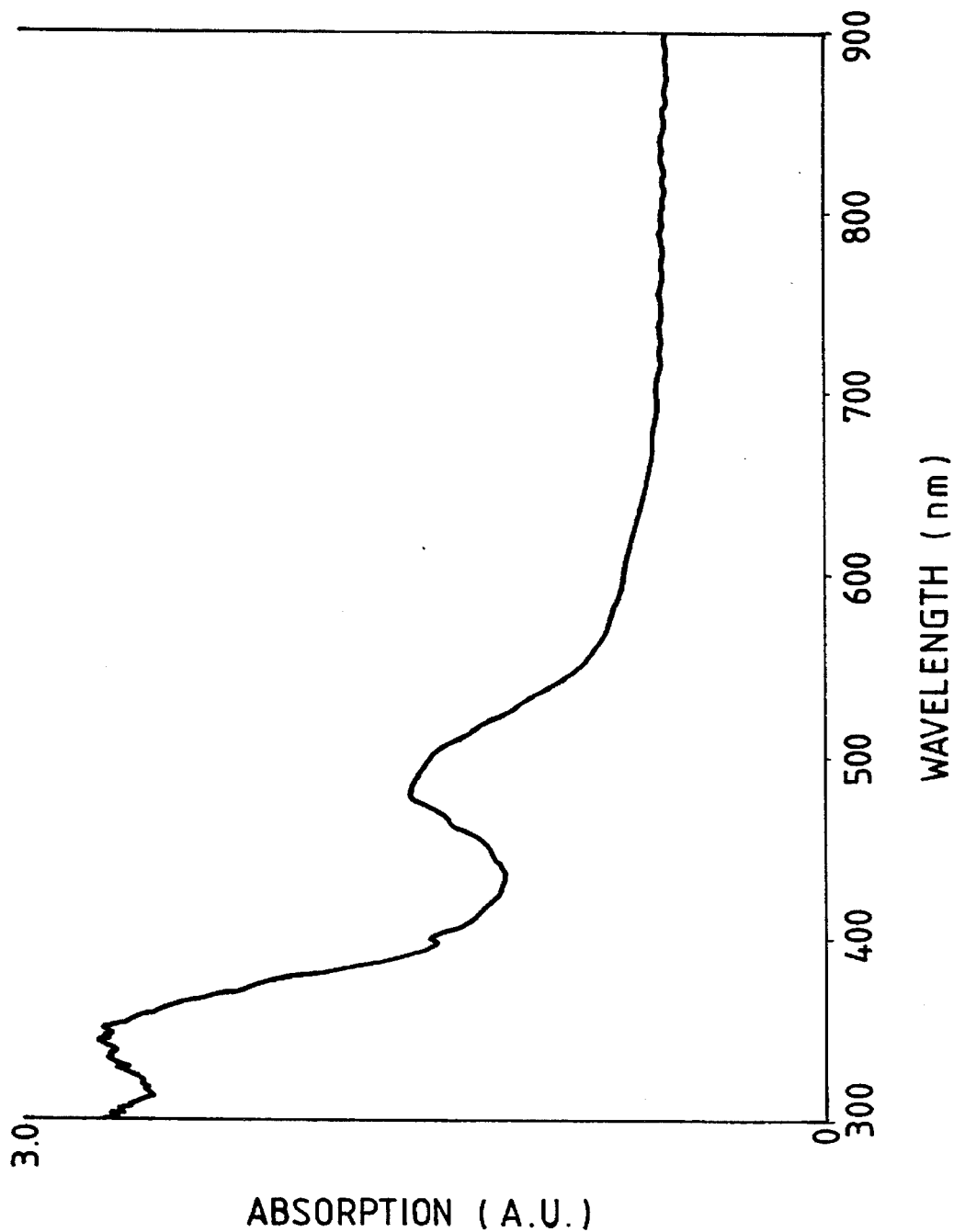
Figure 7:
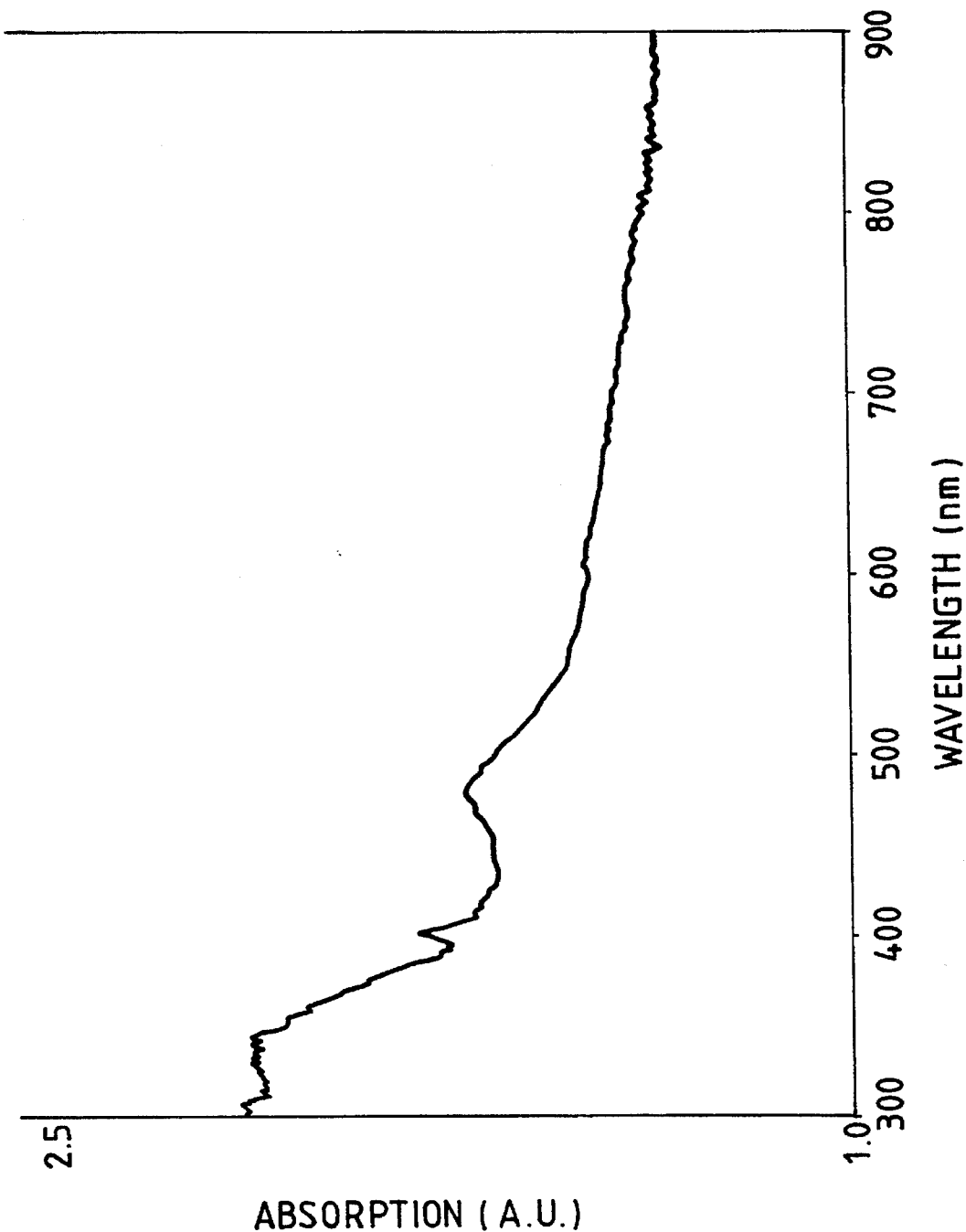
Figure 8:
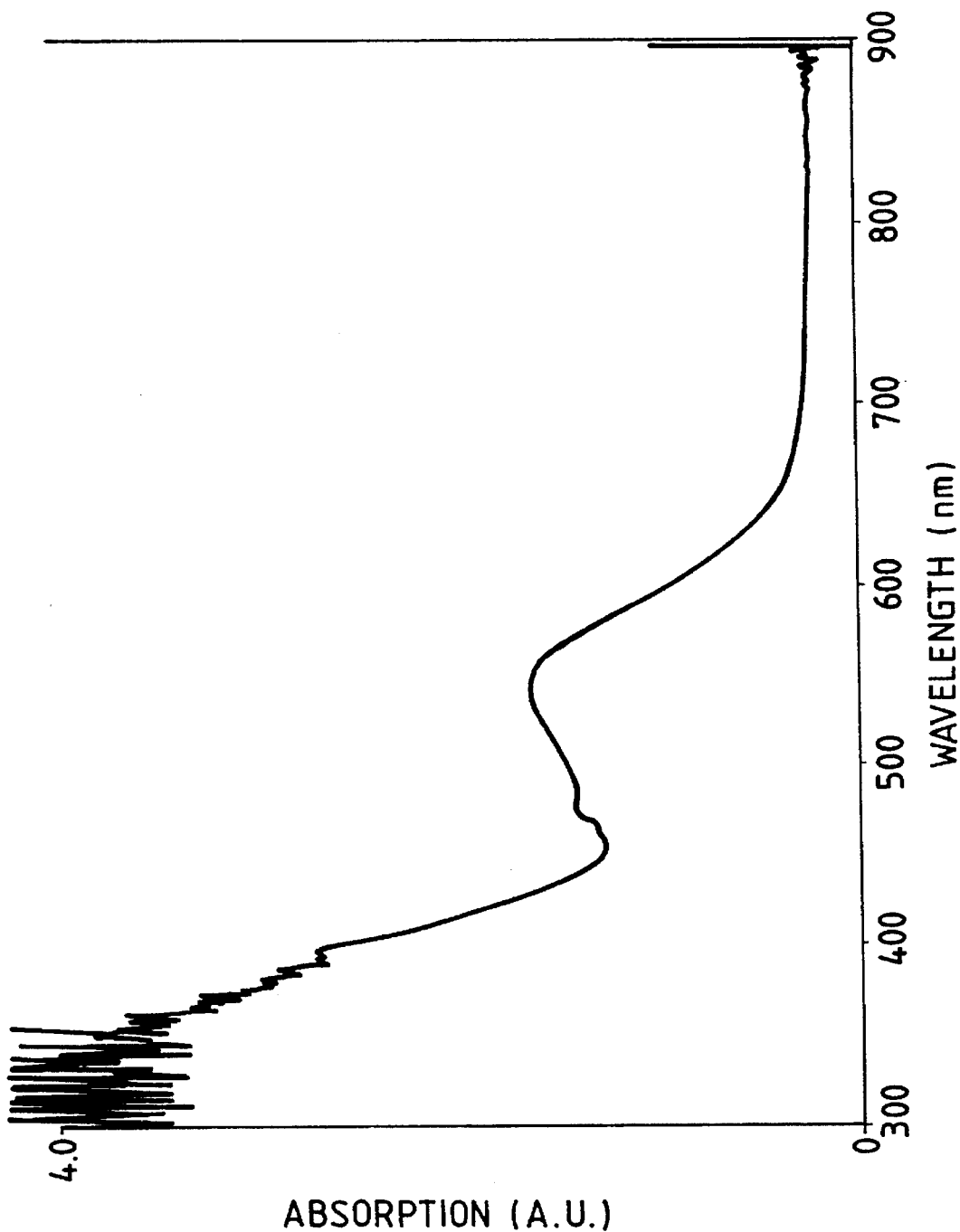
Figure 9:
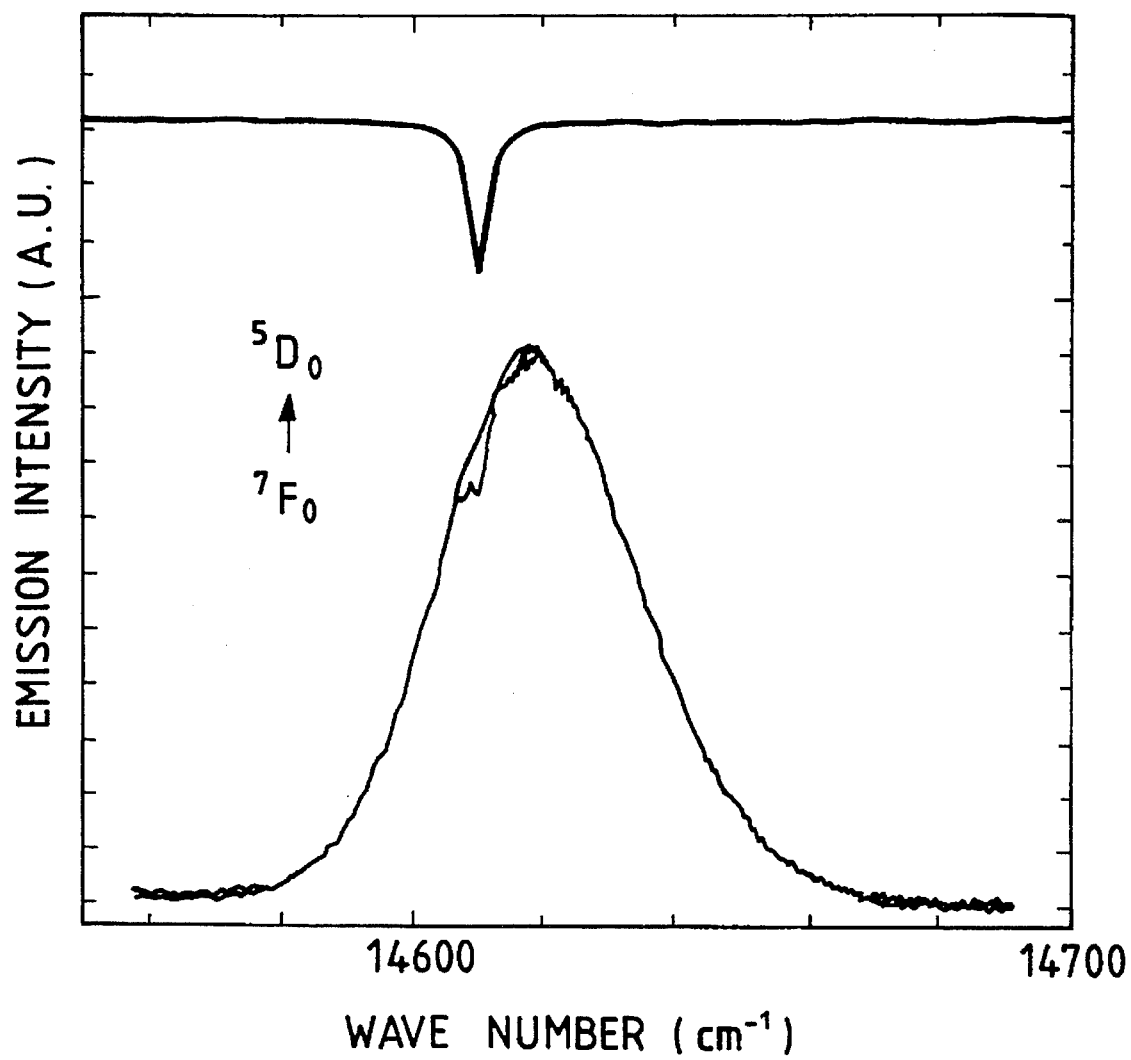
FIGS. 9–12 show typical excitation spectra at the room temperature of the crystals according to the invention.
Figure 10:
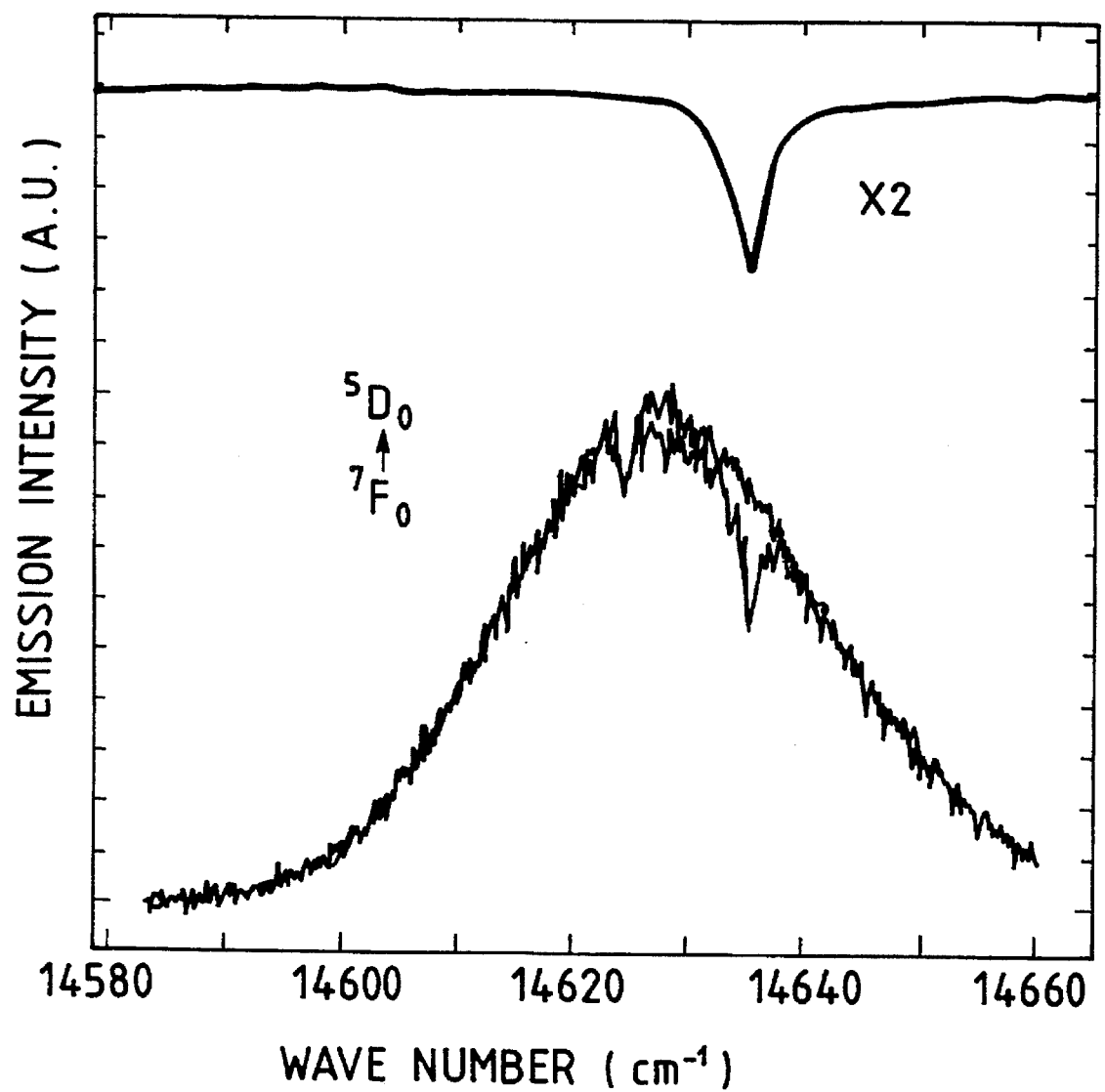
Figure 11:
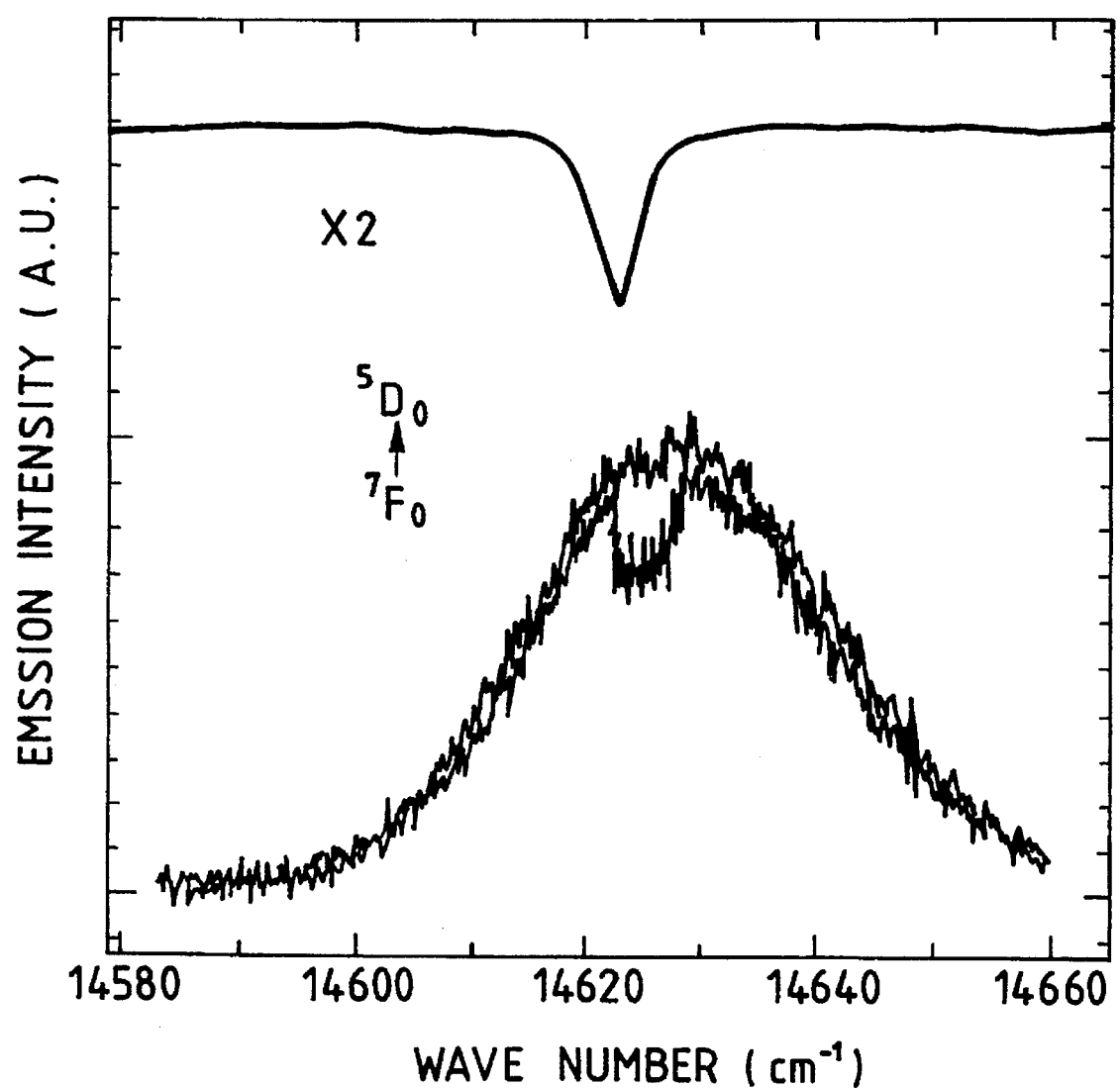
Figure 12:
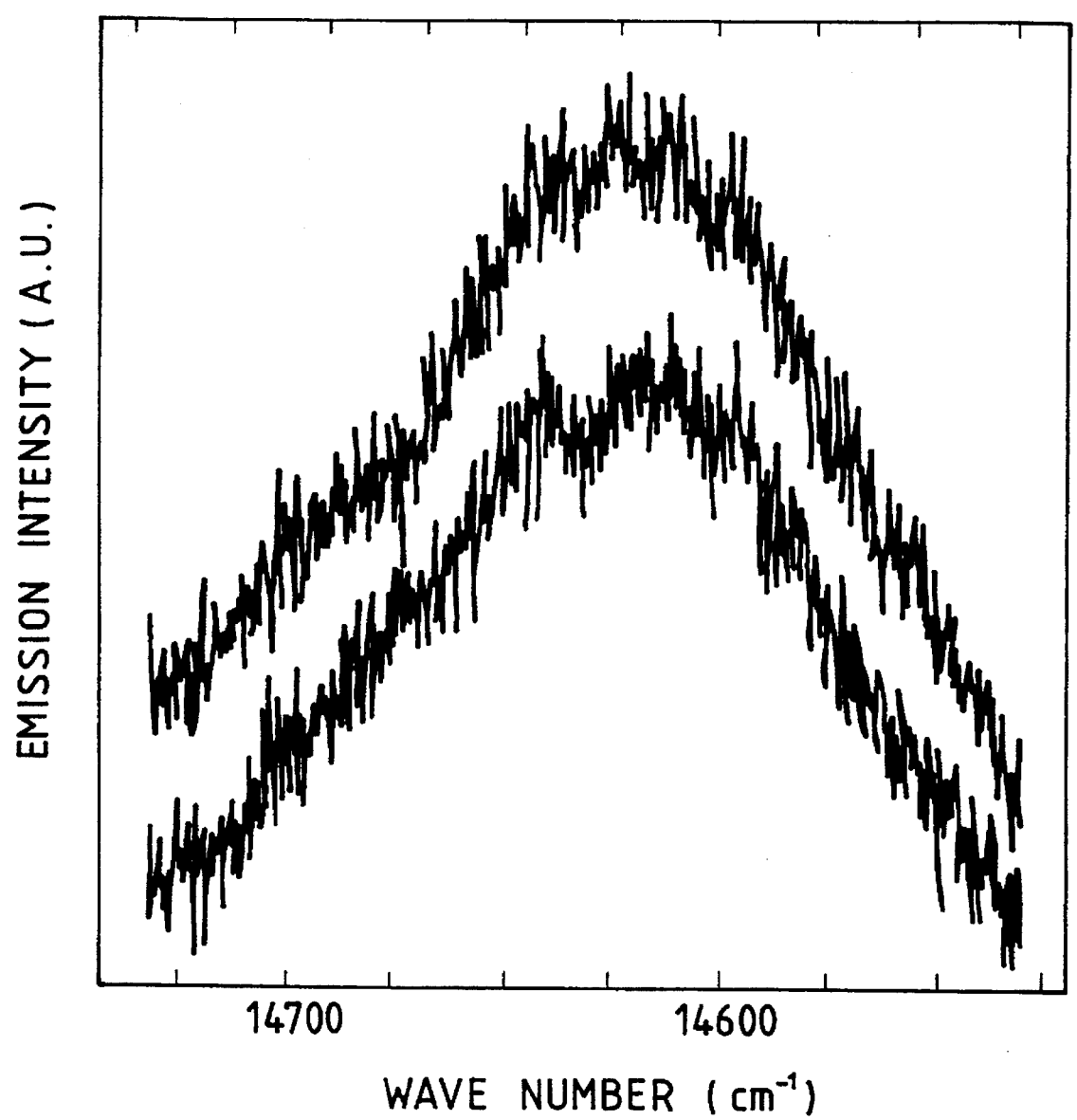

The present invention provides the disordered fluorite-type photochemical hole burning crystal described in the "summary of the invention" section. In the composition represented by the general formula, the quantity ratio between the components M, A and Ln varies with elements actually employed. Specific combinations of elements will be described below.

In a fluorite-type crystal containing $Sm^{2+}$ as photoactive ions and having a composition $Sm_xCa_{1-x}NaYF_6$, parameter x should satisfy $0.001 \leq x \leq 0.5$. If x is smaller than 0.001, the absorption and the light emission intensity of the crystal are weak, which is not preferable in terms of hole performance. Parameter x being larger than 0.5 is not preferable either, because concentration quenching may occur.

In a fluorite-type crystal containing $Sm^{2+}$ as photoactive ions and having a composition $Sm_xCa_{1-x-y}Sr_{1-x-z}NaYF_6$, parameter x should satisfy $0.001 \leq x \leq 0.5$, parameter y should satisfy $0 \leq y \leq 0.5$, and parameter z should satisfy $0 \leq z \leq 0.5$. If x, which represents the quantity of $Sm^{2+}$, is smaller than 0.001, the absorption and the light emission intensity of the crystal are weak, which is not preferable in terms of hole performance. Parameter x being larger than 0.5 is not preferable either, because concentration quenching may occur. Excessively large y and z are not preferable, because many crystal defects may occur.

In a fluorite-type crystal containing $Sm^{2+}$ as photoactive ions and having a composition $Sm_xCa_{1-x-y}Sr_{1-x-z}Na_qGd_pY_{1-p}F_6$, parameter x should satisfy $0.001 \leq x \leq 0.5$, and parameters y and z should satisfy $0 \leq y, z \leq 1$. Parameters p and q should satisfy $0.5 \leq p, q \leq 1$. If x is smaller than 0.001, the absorption and the light emission intensity of the crystal are weak, which is not preferable in terms of hole performance. Parameter x being larger than 0.5 is not preferable either, because concentration quenching may occur. A highly disordered solid solution is formed with parameters y, z and p within the ranges specified above. Parameters y, z and p being larger than the above-specified ranges are not preferable, because many crystal defects may occur. Parameter q being smaller than the above-specified range is not preferable, because the hole formation temperature may be too low.

In a fluorite-type crystal containing $Sm^{2+}$ as photoactive ions and having a composition $Sm_pCa_{1-p-q}Sr_{p+q}Na_tRe_{1-r}Re'_rF_{6-v}X_v$, Re and Re' are Y or Gd, and X is an element selected from Cl, Br and I. Parameter p should satisfy $0.001 \leq p \leq 0.5$, and parameter q should satisfy $0 \leq q \leq 0.5$. Parameter t should satisfy $0.5 \leq t \leq 1$, parameter r should satisfy $0 \leq r \leq 0.5$, and parameter v should satisfy $0 \leq v \leq 1$. If p is smaller than 0.001, the absorption and the light emission intensity of the crystal are weak, which is not preferable in terms of hole performance. Parameter x being larger than 0.5 is not preferable either, because concentration quenching may occur.

A highly disordered solid solution is formed with parameters q, r and v within the ranges specified above. Parameters q, r and v being larger than the above-specified ranges are not preferable, because many crystal defects may occur. Parameter t being smaller than the above-specified range is not preferable, because the hole formation temperature may be too low. Further, parameter v being larger than 1 is not preferable, because a second phase appears, that is, a single-phase crystal is not obtained.

In a fluorite-type crystal containing $Sm^{2+}$ as photoactive ions and having a composition $Sm_pCa_{1-p-q}Sr_{p+q}A_tNa_{1-t}Re_{1-r}Re'_rF_{6-v}X_v$, A is K or Rb, Re and Re' are Y or Gd, and X is an element selected from Cl, Br and I. Parameter p should satisfy $0.001 \leq p \leq 0.5$, and parameter q should satisfy $0 \leq q \leq 0.5$. Parameter t should satisfy $0 < t \leq 0.5$, parameter r should satisfy $0 \leq r \leq 0.5$, and parameter v should satisfy $0 \leq v \leq 1$. If p is smaller than 0.001, the absorption and the light emission intensity of the crystal are weak, which is not preferable in terms of hole performance. Parameter x being larger than 0.5 is not preferable either, because concentration quenching may occur.

A highly disordered solid solution is formed with parameters q, t, r and v within the ranges specified above. Parameters q, t, r and v being larger than the above-specified ranges are not preferable, because many crystal defects may occur.

In a fluorite-type crystal containing $Sm^{2+}$ as photoactive ions and having a composition $Sm_xM_{1-x-y}Sr_{1-x-z}A_pNa_{1-p}Re_qRe'_{1-q}F_6$, M is Ca or Ba, A is K or Rb, and Re and Re' are Y or Gd. Parameters x, y, z, p and q should satisfy $0.001 \leq x \leq 0.5$, $0 \leq y, z \leq 1$ and $0.5 \leq p, q \leq 1$. If x is smaller than 0.001, the absorption and the light emission intensity of the crystal are weak, which is not preferable in terms of hole performance. Parameter x being larger than 0.5 is not preferable either, because concentration quenching may occur. A highly disordered solid solution is formed with parameters y, z, p and q within the ranges specified above. Parameters y, z, p and q being larger than the above-specified ranges are not preferable, because many crystal defects may occur.

In a fluorite-type crystal containing $Sm^{2+}$ as photoactive ions and having a composition $Sm_xCa_{1-x-y}Sr_{1-x-z}NaCe_pRe_{1-p}F_6$, Re is Gd or La. Parameters x, y, z and p should satisfy $0.001 \leq x \leq 0.5$, $0 \leq y, z \leq 1$ and $0.5 \leq p \leq 1$. If x is smaller than 0.001, the absorption and the light emission intensity of the crystal are weak, which is not preferable in terms of hole performance. Parameter x being larger than 0.5 is not preferable either, because concentration quenching may occur. A highly disordered solid solution is formed with parameters y, z and p within the ranges specified above. Parameters y, z and p out of the above-specified ranges are not preferable, because cations are less disordered and a single-phase crystal is not obtained.

In a fluorite-type crystal containing $Sm^{2+}$ as photoactive ions and having a composition $Sm_pCa_{1-p}NaReF_{6-q}X_q$, Re is Y or Gd, and X is an element selected from Cl, Br and I. Parameters p and q should satisfy $0.001 \leq p \leq 0.5$ and $0 \leq q < 1$. If p, which represents the quantity of $Sm^{2+}$, is smaller than 0.001, the absorption and the light emission intensity of the crystal are weak, which is not preferable in terms of hole performance. Parameter x being larger than 0.5 is not preferable either, because concentration quenching may occur. A highly disordered solid solution is formed with parameters q within the above-specified range, i.e., $0 \leq q < 1$. Parameter q out of this range is not preferable, because cations are less disordered and a single-phase crystal is not obtained.

In a fluorite-type crystal containing $Sm^{2+}$ as photoactive ions and having a composition $Sm_xM_{1-x-y}M'_{x+y}A_{1-t}Ln_zLn'_{1-z}F_{6-t}$, M and M' are elements selected from Ca, Sr and Ba, A is an element selected from K, Rb and Cs, and Ln and Ln' are elements selected from La, Y and Gd. Parameters x, y, z and t should satisfy $0.001 \leq x \leq 0.2$, $0 \leq y \leq 0.5$, $0 \leq z \leq 1$ and $0 \leq t \leq 1$.

If x, which represents the quantity of $Sm^{2+}$, is smaller than 0.001, the absorption and the light emission intensity of the crystal are weak, which is not preferable in terms of hole performance. Parameter x being larger than 0.2 is not preferable either, because concentration quenching may occur. With parameters y and z within the above-specified ranges, i.e., $0 \leq y \leq 0.5$ and $0 \leq z \leq 1$, a highly disordered solid solution is formed, which is preferable to increase the multiplicity. However, parameters y and z out of these ranges are not preferable, because cations are less disordered and a fluorite-type solid solution is not obtained. Parameter t out of the above-specified range, i.e., $0 \leq t \leq 1$ is not preferable, because there occur many defects of F to increase the hole width.

In general, in methods of producing crystals like the crystal of the invention, $Sm^{2+}$ ions obtained by reduction are likely oxidized. In contrast, in the fluorite-type crystal of the invention, $Sm^{2+}$ ions can exist in a stable state. Further, a crystal containing $Sm^{2+}$ has a high activation energy of optical ionization, and $Sm^{3+}$ ions, which are produced by hole formation, also exist in a stable state. Therefore, among various hole burning materials, the fluorite-type crystal of the invention is expected to exhibit superior performance as an optical recording material that operates at the room temperature.

Next, a description will be made of a production method according to the invention.

Materials of a target crystal that are a halogenide or oxide of Sm as active ions and halogenides, i.e., a fluoride, chloride, bromide, iodide, etc. of components other than Sm that are, for instance, Ca, Na, Ba, Sr, Ce, Y, Ga and La are mixed in advance at a quantity ratio to provide an atom ratio that is determined using the composition of the target crystal as a reference. For example, to produce a fluorite-type crystal having a composition $Sm_xCa_{1-x}NaYF_6$, materials are so mixed as to provide a ratio $Ca:Sm:Na:Y = 1-x:x:1:1$ $(0.001 \leq x \leq 0.5)$.

A crystal is grown by melting and solidifying the materials in a non-oxidizing atmosphere using a reducing gas, for instance, a hydrogen gas, a mixture of a hydrogen gas and a carbon monoxide gas, a mixture of a hydrogen gas and a carbon dioxide gas, a mixture of a carbon monoxide gas and a carbon dioxide gas, a gas obtained by mixing one of the above gases with a carrier gas of helium, argon or nitrogen, or a gas of helium, argon, nitrogen, or the like.

In the crystal producing method of the invention, the melting temperature is 1,000° to 1,500° C. The solidification is performed by a slow cooling method or a heat exchange method of 0.1° to 5° C./min, a lifting method of 1 to 5 mm/hr, a floating zone method, a Bridgman method, or some other method. A crystal thus obtained has a crystal structure of the cubit system.

Now, the invention will be described in more detail by way of examples.

EXAMPLES 1, 5, 9, 13, 17, 21, 25, 29 and 33

Materials shown in Table 1 were so prepared as to provide an atom ratio shown in Table 2, then mixed and shaped. A shaped body was put in a molybdenum crucible, and melted and at a melting temperature shown in Table 2 and then solidified in an argon gas atmosphere including hydrogen of 5 vol %. FIGS. 1–4 show typical examples of X-ray diffraction results of crystals thus produced (Examples 1, 5, 29 and 33). The X-ray diffraction results showed that each crystal had a disordered single-crystal phase represented by a general composition formula shown in Table 3. Table 3 also lists lattice constants. (Each of crystals produced in Examples 13, 17 and 29 was of a disordered Sm solid solution type, that is, had a solid solution type single-crystal phase as in the case of the other Examples.) FIGS. 5–8 show typical examples of absorption spectra of crystals produced (Examples 1, 5, 29 and 33). The spectra show a strong absorption due to the f-d transition of $Sm^{2+}$, confirming that the crystals contain $Sm^{2+}$.

The crystals were subjected to PHB measurements in the following manner. Each sample, kept at 293K, was irradiated with a laser beam of a DCM dye laser (about 100 mW) for 1–300 sec. The wavelength of the laser was so set as to cause resonance with the $^5D_0-^7F_0$ transition. By monitoring emission light of 720 nm corresponding to the $^5D_0-^7F_2$ transition, an excitation spectrum with excitation by a wavelength-varied laser beam from the DCM dye laser (intermittent irradiation) was obtained.

FIGS. 9–12 show typical examples of excitation spectra each obtained at the room temperature after irradiating a sample for 300 sec with a laser beam of 692 nm from the DCM dye laser (Examples 1, 5, 29 and 33). Permanent hole burning was found in each spectrum. Hole widths obtained at the room temperature are shown in Table 3. No hole filling phenomenon occurs, and it is possible to create 10 to 20 holes. Electron traps produced by the hole burning photochemical reaction are $Sm^{3+}$. That is, the photochemical reaction is expressed as: $Sm^{2+}+(trap\ center) \rightarrow Sm^{3+}+(trap\ center)^-$.

Figure 13:
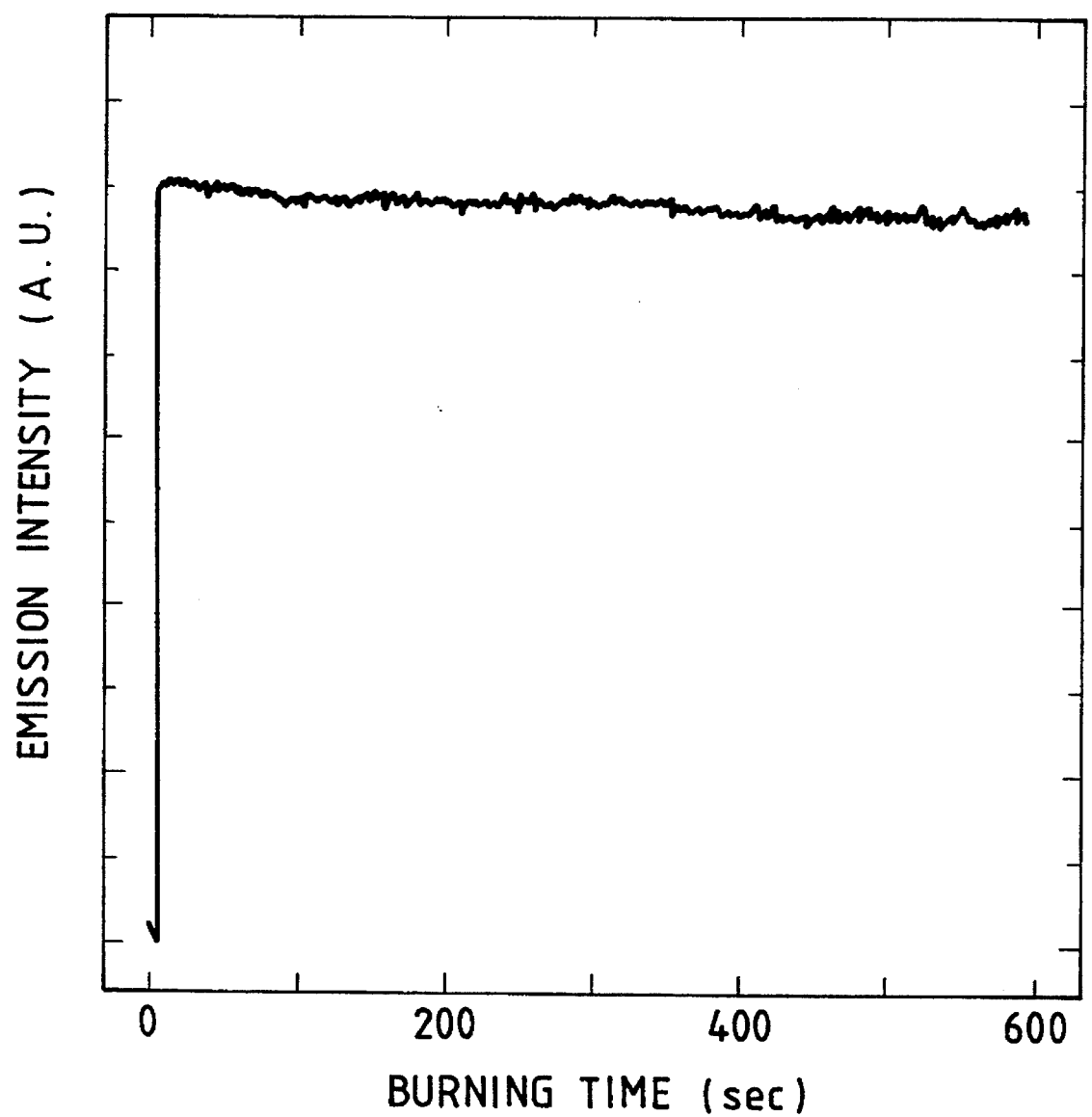
FIG. 13 shows a relationship between the hole formation time and the hole depth at the room temperature in Example 33.

FIG. 13 shows a relationship between a hole formation time and a hole depth at the room temperature in Example 33.

The excitation spectra shown in FIGS. 9–12 are not gate type spectra (the selected excitation wavelength $\lambda_1$ is equal to the gate wavelength $\lambda_2$). Therefore, by shortening the gate wavelength, the hole burning efficiency can be improved or the hole formation time can be reduced.

TABLE 1

| | Materials |
|---|---|
| Ex. 1 | $SmF_3$, $CaF_2$, NaF, $YF_3$ |
| Ex. 5 | $SmF_3$, $CaF_2$, $SrF_2$, NaF, $YF_3$ |
| Ex. 9 | $SmF_3$, $CaF_2$, $SrF_2$, NaF, $GdF_3$, $YF_3$ |
| Ex. 13 | $SmF_3$, $CaF_2$, $SrBr_2$, NaF, NaBr, $GdBr_3$, $YF_3$ |
| Ex. 17 | $SmF_3$, $CaF_2$, $SrBr_2$, NaF, KBr, $GdBr_3$, $YF_3$ |
| Ex. 21 | $SmF_3$, $CaF_2$, NaF, KF, $YF_3$ |
| Ex. 25 | $SmF_3$, $CaF_2$, $SrF_2$, NaF, $CeF_3$, $GdF_3$ |
| Ex. 29 | $SmF_3$, $CaF_2$, $CaBr_2$, NaF, NaBr, $YF_3$, $YBr_3$ |
| Ex. 33 | $SmF_3$, $CaF_2$, $SrF_2$, KF, $LaF_3$ |

TABLE 2

| | Atom ratio | | | | | | | |
|---|---|---|---|---|---|---|---|---|
| | Sm | Ca | Sr | Na | K | La | Ce | Gd |
| Ex. 1 | 0.02 | 0.98 | | 1 | | | | |
| Ex. 5 | 0.04 | 0.48 | 0.48 | 1 | | | | |
| Ex. 9 | 0.04 | 0.48 | 0.48 | 1 | | | | 0.5 |
| Ex. 13 | 0.02 | 0.88 | 0.1 | 1 | | | | 0.1 |
| Ex. 17 | 0.02 | 0.88 | 0.1 | 0.9 | 0.1 | | | 0.9 |
| Ex. 21 | 0.04 | 0.96 | | 0.5 | 0.5 | | | |
| Ex. 25 | 0.04 | 0.48 | 0.48 | 1 | | | 0.5 | 0.5 |
| Ex. 29 | 0.04 | 0.96 | | 1 | | | | |
| Ex. 33 | 0.02 | 0.49 | 0.49 | | 1 | 1 | | |

| | Atom ratio | | | Melting temp. |
|---|---|---|---|---|
| | Y | F | Br | (°C.) |
| Ex. 1 | 1 | 6 | | 1,300 |
| Ex. 5 | 1 | 6 | | 1,300 |
| Ex. 9 | 0.5 | 6 | | 1,450 |
| Ex. 13 | 0.9 | 5.4 | 0.6 | 1,450 |
| Ex. 17 | 0.1 | 5.4 | 0.6 | 1,450 |
| Ex. 21 | 1 | 6 | | 1,450 |
| Ex. 25 | | 6 | | 1,450 |
| Ex. 29 | 1 | 5.94 | 0.06 | 1,450 |
| Ex. 33 | | 6 | | 1,450 |

TABLE 3

|  | Lattice constant (Å) | Hole width (cm$^{-1}$) | General composition formula |
| --- | --- | --- | --- |
| Ex. 1 | 5.4808 | 4 | α-CaNaYF$_6$:Sm |
| Ex. 5 | 5.5665 | 4 | α-CaNaYF$_6$:Sm |
| Ex. 9 | 5.4909 | 3 | α-CaSrNaGdYF$_6$:Sm |
| Ex. 13 | 5.5375 | 3 |  |
| Ex. 17 | 5.4646 | 3 |  |
| Ex. 21 | 5.4891 | 4 | α-CaSrNaGdYF$_6$:Sm |
| Ex. 25 | 5.5335 | 4 | α-CaSrNaCeGdYF$_6$:Sm |
| Ex. 29 | 5.4574 | 4 |  |
| Ex. 33 | 5.7431 | 9 | α-CaNaYF$_6$:Sm |

EXAMPLES 2, 6, 10, 14, 18, 22, 26, 30, 34

Materials shown in Table 4 were so prepared as to provide an atom ratio shown in Table 5, then mixed and shaped. A shaped body was put in a carbon crucible, and heat-melted at a temperature shown in Table 5 in a gas atmosphere obtained by mixing, into an argon gas, a hydrogen gas and a carbon dioxide gas of 500:1 in volume, and then solidified by a slow cooling method. It was confirmed by the same X-ray diffraction measurement as in Example 1 that crystals produced were of a single phase. It was also confirmed by the absorption spectrum measurement that the crystals contained Sm$^{2+}$.

The PHB measurement was performed on the crystals in the same manner as in Example 1. After a burning operation was conducted at the room temperature, it was confirmed that holes existed in measured spectra. Widths of holes at the room temperature are shown in Table 5.

Figure 14:
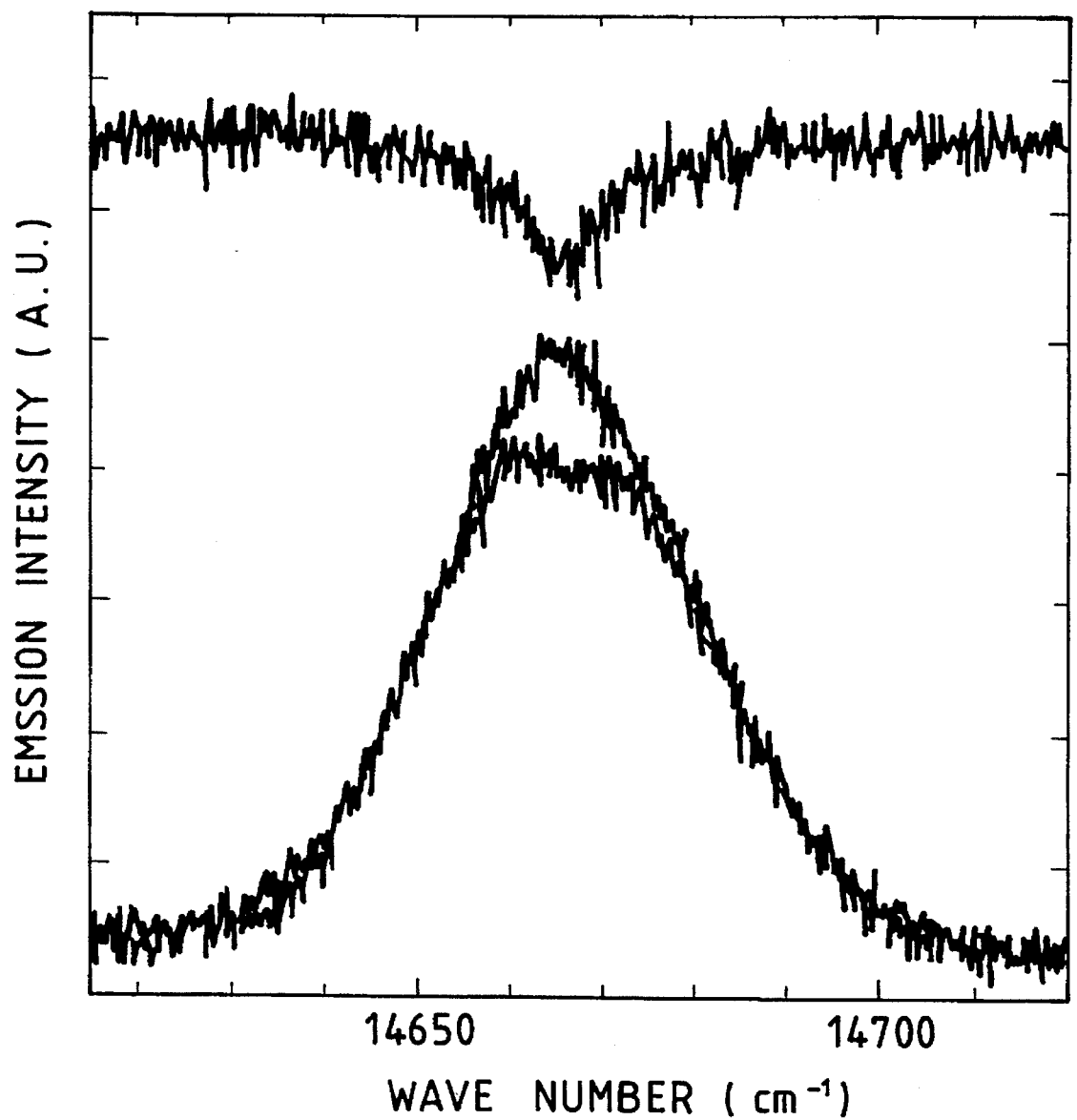
FIG. 14 shows excitation spectra before and after a hole burning operation at the room temperature in Example 34.
Figure 15:
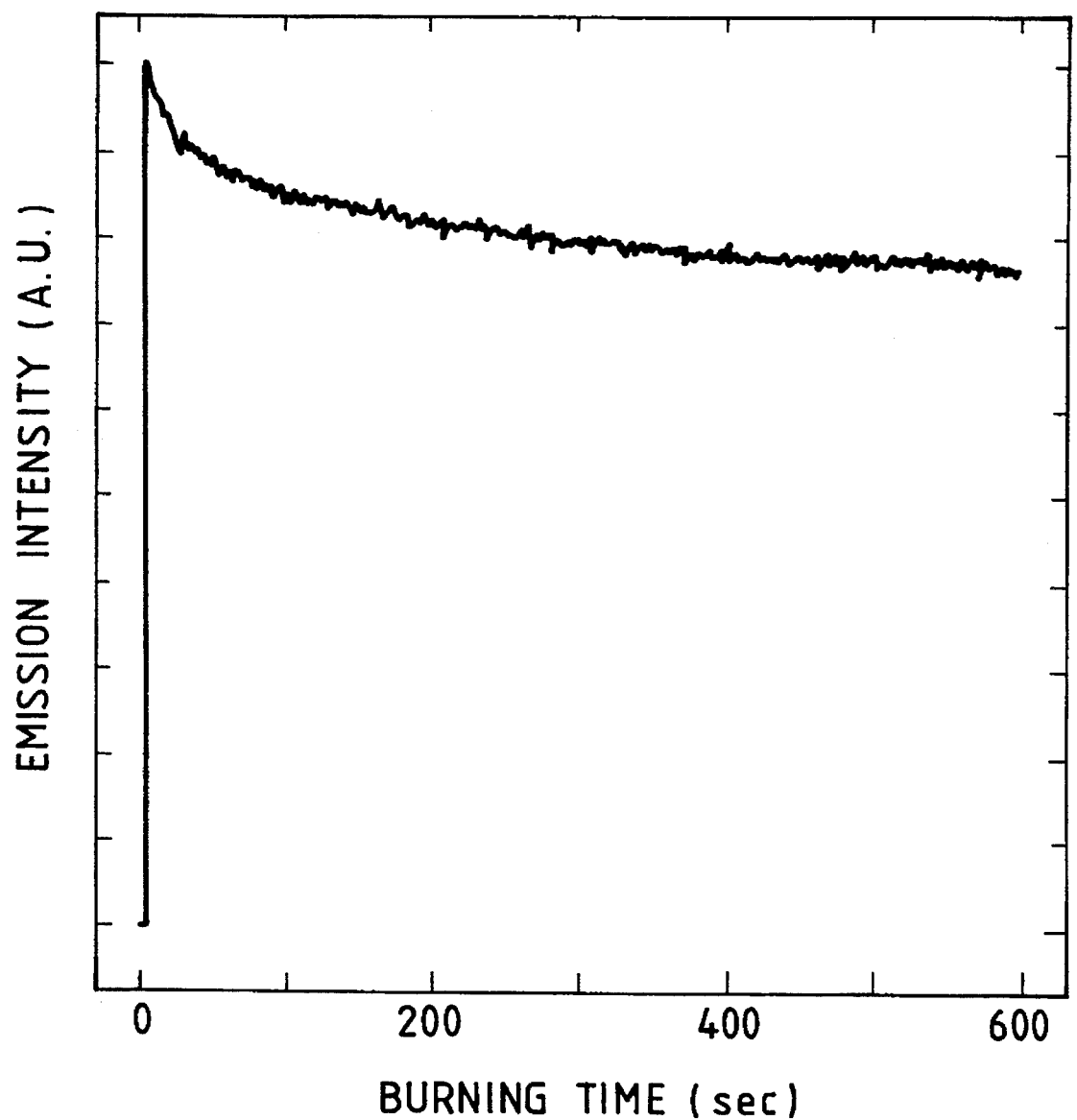
FIG. 15 shows a relationship between the hole formation time and the hole depth at the room temperature in Example 34.

FIGS. 14 and 15 show excitation spectra before and after a hole burning operation at the room temperature and a relationship between the hole formation time and the hole depth in Example 34.

TABLE 4

|  | Materials |
| --- | --- |
| Ex. 2 | SmF$_2$, CaF$_2$, NaF, YF$_3$ |
| Ex. 6 | SmF$_2$, CaF$_2$, SrF$_2$, NaF, YF$_3$ |
| Ex. 10 | SmF$_2$, CaF$_2$, SrF$_2$, NaF, GdF$_3$, YF$_3$ |
| Ex. 14 | SmF$_2$, CaF$_2$, SrCl$_2$, NaF, NaCl, GdCl$_3$, YF$_3$ |
| Ex. 18 | SmF$_2$, CaF$_2$, SrCl$_2$, NaF, KCl, GdCl$_3$, YF$_3$ |
| Ex. 22 | SmF$_2$, CaF$_2$, SrF$_2$, NaF, KF, YF$_3$ |
| Ex. 26 | SmF$_2$, CaF$_2$, SrF$_2$, NaF, CeF$_3$, LaF$_3$ |
| Ex. 30 | SmF$_2$, CaF$_2$, CaCl$_2$, NaF, NaCl, YF$_3$, YCl$_3$ |
| Ex. 34 | SmF$_2$, CaF$_2$, KF, LaF$_3$ |

TABLE 5

|  | Atom ratio | | | | | | | |
| --- | --- | --- | --- | --- | --- | --- | --- | --- |
|  | Sm | Ca | Sr | Na | K | La | Ce | Gd |
| Ex. 2 | 0.04 | 0.96 |  | 1 |  |  |  |  |
| Ex. 6 | 0.02 | 0.49 | 0.49 | 1 |  |  |  |  |
| Ex. 10 | 0.02 | 0.49 | 0.49 | 1 |  |  |  | 0.5 |
| Ex. 14 | 0.02 | 0.88 | 0.1 | 1 |  |  |  | 0.1 |
| Ex. 18 | 0.02 | 0.88 | 0.1 | 0.9 | 0.1 |  |  | 0.1 |
| Ex. 22 | 0.02 | 0.49 | 0.49 | 0.5 | 0.5 |  |  |  |
| Ex. 26 | 0.02 | 0.49 | 0.49 | 1 |  | 0.5 | 0.5 |  |
| Ex. 30 | 0.02 | 0.98 |  | 1 |  |  |  |  |
| Ex. 34 | 0.02 | 0.98 |  |  | 1 | 1 |  |  |

TABLE 5-continued

|  | Atom ratio | | | Melting temp. (°C.) | Hole width (cm$^{-1}$) |
| --- | --- | --- | --- | --- | --- |
|  | Y | F | Cl | | |
| Ex. 2 | 1 | 6 |  | 1,350 | 5–6 |
| Ex. 6 | 1 | 6 |  | 1,350 | 5 |
| Ex. 10 | 0.5 | 6 |  | 1,350 | 3 |
| Ex. 14 | 0.9 | 5.4 | 0.6 | 1,450 | 3 |
| Ex. 18 | 0.9 | 5.4 | 0.6 | 1,450 | 3 |
| Ex. 22 | 1 | 6 |  | 1,450 | 3 |
| Ex. 26 |  | 6 |  | 1,450 | 4 |
| Ex. 30 | 1 | 5.94 | 0.06 | 1,450 | 4 |
| Ex. 34 |  | 6 |  | 1,500 | 7 |

EXAMPLES 3, 7, 11, 15, 19, 23, 27, 31, 35

Materials shown in Table 6 were so prepared as to provide an atom ratio shown in Table 7, then mixed and shaped. A shaped body was put in a carbon crucible, and heat-melted in an argon gas atmosphere including hydrogen of 1 vol %. A crystal was grown from the molten materials at a growth speed shown in Table 7 by a floating zone method. It was confirmed by the X-ray diffraction measurement that crystals produced were of a single phase. Excitation spectra of the crystals were measured after irradiation with a laser beam from the DCM dye laser. As a result, it was confirmed that holes were successfully created at the room temperature in the crystals as in the case of the group of Example 1.

TABLE 6

|  | Materials |
| --- | --- |
| Ex. 3 | SmF$_3$, CaF$_2$, NaF, YF$_3$ |
| Ex. 7 | SmF$_3$, CaF$_2$, SrF$_2$, NaF, YF$_3$ |
| Ex. 11 | SmF$_3$, CaF$_2$, SrF$_2$, NaF, GdF$_3$ |
| Ex. 15 | SmF$_3$, CaF$_2$, SrI$_2$, NaF, NaI, GdI$_3$, YF$_3$ |
| Ex. 19 | SmF$_3$, CaF$_2$, SrI$_2$, NaF, RbI, YF$_3$, YI$_3$ |
| Ex. 23 | SmF$_3$, CaF$_2$, NaF, KF, YF$_3$ |
| Ex. 27 | SmF$_3$, CaF$_2$, SrF$_2$, NaF, CeF$_3$ |
| Ex. 31 | SmF$_3$, CaF$_2$, CaI$_2$, NaF, NaI, YF$_3$, YI$_3$ |
| Ex. 35 | SmF$_3$, CaF$_2$, SrF$_2$, RbF, LaF$_3$ |

TABLE 7

|  | Atom ratio | | | | | | |
| --- | --- | --- | --- | --- | --- | --- | --- |
|  | Sm | Ca | Sr | Na | Rb | La | Ce | Gd |
| Ex. 3 | 0.04 | 0.96 |  | 1 |  |  |  |  |
| Ex. 7 | 0.04 | 0.76 | 0.31 | 1 |  |  |  |  |
| Ex. 11 | 0.04 | 0.48 | 0.48 | 1 |  |  | 1 |  |
| Ex. 15 | 0.02 | 0.88 | 0.1 | 1 |  |  |  | 0.1 |
| Ex. 19 | 0.02 | 0.88 | 0.1 | 0.9 | 0.1 |  |  |  |
| Ex. 23 | 0.04 | 0.96 |  | 0.5 | 0.5 |  |  |  |
| Ex. 27 | 0.04 | 0.48 | 0.48 | 1 |  |  | 1 |  |
| Ex. 31 | 0.04 | 0.96 |  | 1 |  |  |  |  |
| Ex. 35 | 0.02 | 0.49 | 0.49 |  | 1 | 1 |  |  |

|  | Atom ratio | | | Growth speed (mm/h) |
| --- | --- | --- | --- | --- |
|  | Y | F | I | |
| Ex. 3 | 1 | 6 |  | 1 |
| Ex. 7 | 1 | 6 |  | 1 |
| Ex. 11 |  | 6 |  | 1 |
| Ex. 15 | 0.9 | 5.4 | 0.6 | 0.6 |
| Ex. 17 | 0.9 | 5.4 | 0.6 | 0.6 |
| Ex. 23 | 1 |  |  | 0.3 |
| Ex. 27 |  |  |  | 1 |
| Ex. 31 | 1 | 5.94 | 0.06 | 1 |

TABLE 7-continued

| Ex. 35 | 6 | 0.6 |

EXAMPLES 4, 8, 12, 16, 20, 24, 28, 32, 36

Materials shown in Table 8 were so prepared as to provide an atom ratio shown in Table 9, then mixed and shaped. In a molybdenum crucible, a shaped body was heated by high-frequency induction and melted in an argon gas atmosphere including hydrogen of 2 vol % so as to include Sm2+. A crystal was lifted in the [100]axis direction at a crystal rotation speed and a lifting speed shown in Table 9. In this manner, a crystal of about 20 mm in diameter and about 50 mm in length was grown. It was confirmed by the X-ray diffraction measurement that crystals produced were of a single phase.

Absorption spectra showed that the crystals contained $Sm^{2+}$. PHB measurements were conducted in the same manner as in Example 1. After irradiation with a laser beam, holes that permanently exist at the room temperature were found in the absorption spectra. The hole width and the number of holes were approximately the same as in the group of Example 1.

TABLE 8

| | Materials |
|---|---|
| Ex. 4 | $SmF_2$, $CaF_2$, NaF, $YF_3$ |
| Ex. 8 | $SmF_3$, $CaF_2$, $SrF_2$, NaF, $YF_3$ |
| Ex. 12 | $SmF_3$, $CaF_2$, $SrF_2$, NaF, $GdF_3$, $YF_3$ |
| Ex. 16 | $SmF_3$, $CaF_2$, $SrBr_2$, NaF, NaBr, $GdF_3$, $YF_3$ |
| Ex. 20 | $SmF_3$, $CaF_2$, $SrBr_2$, NaF, KBr, $GdF_3$, $YF_3$ |
| Ex. 24 | $SmF_3$, $CaF_2$, NaF, KF, $YF_3$ |
| Ex. 28 | $SmF_3$, $CaF_2$, NaF, $CeF_3$, $LaF_3$ |
| Ex. 32 | $SmF_3$, $CaF_2$, $CaBr_2$, NaF, NaBr, $GdF_3$, $GdBr_3$ |
| Ex. 36 | $SmF_3$, $CaF_2$, RbF, $LaF_3$ |

TABLE 9

| | Atom ratio | | | | | | |
|---|---|---|---|---|---|---|---|
| | Sm | Ca | Sr | Na | K | Rb | La | Ce |
| Ex. 4 | 0.02 | 0.98 | | 1 | | | | |
| Ex. 8 | 0.05 | 0.475 | 0.475 | 1 | | | | |
| Ex. 12 | 0.05 | 0.95 | | 1 | | | | |
| Ex. 16 | 0.02 | 0.88 | 0.1 | 1 | | | | |
| Ex. 20 | 0.02 | 0.88 | 0.1 | 0.9 | 0.1 | | | |
| Ex. 24 | 0.05 | 0.95 | | 0.5 | 0.5 | | | |
| Ex. 28 | 0.05 | 0.95 | | 1 | | | 0.5 | 0.5 |
| Ex. 32 | 0.05 | 0.95 | | 1 | | | | |
| Ex. 36 | 0.02 | 0.98 | | | | 1 | 1 | |

| | Atom ratio | | | | Crystal rotation speed (rpm) | Lifting speed (mm/h) |
|---|---|---|---|---|---|---|
| | Gd | Y | F | Br | | |
| Ex. 4 | | 1 | 6 | | 10 | 2 |
| Ex. 8 | | 1 | 6 | | 10 | 2 |
| Ex. 12 | 0.5 | 0.5 | 6 | | 10 | 1 |
| Ex. 16 | 0.1 | 0.9 | 5.4 | 0.6 | 10 | 0.4 |
| Ex. 18 | 0.1 | 0.9 | 5.4 | 0.6 | 10 | 0.4 |
| Ex. 24 | | 1 | 6 | | 10 | 0.5 |
| Ex. 28 | | | 6 | | 10 | 0.8 |
| Ex. 32 | 1 | | 5.94 | 0.06 | 10 | 0.4 |
| Ex. 36 | | | 6 | | 15 | 0.4 |

The fluorite-type crystal containing $Sm^{2+}$ according to the invention has a narrower hole width than other crystals including halogen ($SrFCl_{0.5}Br_{0.5}$:$Sm^{2+}$ and $HfF_4$-$BaF_3$ type glass containing $Sm^{2+}$) and borate glass. Further, a larger crystal can be obtained than in other halogenides. With the stable hole burning effect at the room temperature, the crystal of the invention can be a superior optical recording material for a room temperature operation.

Since the fluorite-type crystal of the invention includes an extremely large number of portions having slightly different forms of ion bond between a Sm ion and a $F^-$ ion (Sm—F), it exhibits a refractive index that varies with the wavelength of light. Therefore, it is expected that the crystal of the invention can be used as a hologram multiple recording material or the like utilizing the photorefractive effect.

Because of the existence of a large number of different kinds of Sm—F bonds that are excited by laser beams of different wavelengths, it is possible to create, by irradiation with laser beams of different wavelengths, holes whose widths are adapted to the number of wavelengths. Further, if a voltage is applied between ITO films formed on the hole burning crystal, holes are created for respective wavelengths of laser beams. These holes can be created for various voltage levels. Therefore, the hole burning crystal of the invention can be used as an optical multiple memory operating under an electric field.

What is claimed is:

1. A disordered fluorite photochemical hole burning crystal which contains $Sm^{2+}$ as active ions, and in which a composition except said $Sm^{2+}$ is represented by a general formula $$\alpha\text{-}(MALn)F_{6-v}X_v$$

where $0 \leq v \leq 1$, and M is an element selected from the group consisting of Ca, Sr and Ba, A is an element selected from the group consisting of Na, K, Rb and Cs, Ln is an element selected from the group consisting of Y, La, Gd and Ce, and X is an element selected from the group consisting of Cl, Br and I.

2. The crystal of claim 1, wherein a composition is represented by $Sm_xCa_{1-x}NaYF_6$ where $0.001 \leq x \leq 0.5$.

3. The crystal of claim 1, wherein a composition is represented by $Sm_xCa_{1-x-y}Sr_{1-x-z}NaYF_6$ where $0.001 \leq x \leq 0.5$, $0 \leq y \leq 0.5$, and $0 \leq z < 0.5$.

4. The crystal of claim 1, wherein a composition is represented by $Sm_xCa_{1-x-y}Sr_{1-x-z}Na_qGd_pY_{1-p}F_6$ where $0.001 \leq x \leq 0.5$, $0 \leq y, z \leq 1$, and $0.5 \leq p, q \leq 1$.

5. The crystal of claim 1, wherein a composition is represented by $Sm_pCa_{1-p-q}Sr_{p+q}Na_rRe_{1-r}Re'_tF_{6-v}X_v$ where Re and Re' are Y or Gd, X is an element selected fom the group consisting of Cl, Br and I, and where $0.001 \leq p \leq 0.5$, $0 \leq q \leq 0.5$, $0.5 \leq t \leq 1$, $0 \leq r \leq 0.5$, and $0 \leq v \leq 1$.

6. The crystal of claim 1, wherein a composition is represented by $Sm_pCa_{1-p-q}Sr_{p+q}A_tNa_{1-r}Re_{1-r}Re'_r F_{6-v}X_v$ where A is K or Rb, Re and Re' are Y or Gd, and X is an element selected from the group consisting of Cl, Br and I, and where $0.001 \leq p \leq 0.5$, $0 \leq q \leq 0.5$, $0 < t \leq 0.5$, $0 \leq r \leq 0.5$, and $0 \leq v \leq 1$.

7. The crystal of claim 1, wherein a composition is represented by $Sm_xM_{1-x-y}Sr_{1-x-z}A_pNa_{1-p}Re_qRe'_{1-q} F_6$ where M is Ca or Ba, A is K or Rb, Re and Re' are Y or Gd, and where $0.001 \leq x \leq 0.5$, $0 \leq y, z \leq 1$, and $0.5 \leq p, q \leq 1$.

8. The crystal of claim 1, wherein a composition is represented by $Sm_xCa_{1-x-x}Sr_{1-x-z}NaCe_pRe_{1-p}F_6$ where Re is Gd or La, and where $0.001 \leq x \leq 0.5$, $0 \leq y$, $z \leq 1$, and $0.5 \leq p \leq 1$.

9. The crystal of claim 1, wherein a composition is represented by $Sm_pCa_{1-p}NaReF_{6-q}X_q$ where Re is Y or Gd, and X is an element selected from the group consisting of Cl, Br and I, and where $0.001 \leq p \leq 0.5$, and $0 \leq q < 1$.

10. The crystal of claim 1, wherein a composition is represented by $Sm_xM_{1-x-y}M'_{x+y}A_{1-t}Ln_zLn'_{1-z}F_{6-t}$ where M and M' are elements selected from the group consisting of Ca, Sr and Ba, A is an element selected from the group consisting of K, Rb and Cs, Ln and Ln' are elements selected from the group consisting of La, Y and Gd, and where $0.001 \leq x \leq 0.2$, $0 \leq y \leq 0.5$, $0 \leq z \leq 1$, and $0 \leq t \leq 1$.

* * * * *